United States Patent [19]

Fedeli et al.

[11] Patent Number: 4,592,017
[45] Date of Patent: May 27, 1986

[54] MAGNETIC BUBBLE MEMORY

[75] Inventors: Jean M. Fedeli, St. Egrève; Hubert Jouve, Biviers; Joël Magnin, St. Martin D'Heres; Christian Pisella, Rives/Fure, all of France

[73] Assignee: Commissariat a l'Energie Atomique, Paris, France

[21] Appl. No.: 622,191

[22] Filed: Jun. 19, 1984

[30] Foreign Application Priority Data

Jun. 28, 1983 [FR] France .................. 83 10664

[51] Int. Cl.⁴ .................................. G11C 19/08
[52] U.S. Cl. ........................... 365/19; 365/36
[58] Field of Search ............ 365/36, 19, 20, 21

[56] References Cited

U.S. PATENT DOCUMENTS

| | | | |
|---|---|---|---|
| 4,152,777 | 5/1979 | Baker | 365/15 |
| 4,334,291 | 6/1982 | Geusie et al. | 365/29 |
| 4,443,867 | 4/1984 | Boshra-Riad et al. | 365/36 |
| 4,493,054 | 1/1985 | Boshra-Riad et al. | 365/36 |

FOREIGN PATENT DOCUMENTS 0038754 10/1981 European Pat. Off. .

Primary Examiner—James W. Moffitt

[57] ABSTRACT

A magnetic bubble memory is formed of a series of longitudinally oriented minor registers and at least one transversely oriented major access register, all of these registers having patterns with boundaries defined by ionically implanted zones of a magnetic garnet layer. The memory is formed also with a structure for transferring bubbles from one end of the minor register to the major register, and is further configured with layered material having a predetermined format for displacing the bubbles in each minor register upon application of a rotating magnetic field. The physical structure of the memory also permits a displacement of the bubbles of the major register by the circulation of currents in two electrically conductive sheets which are superimposed on the magnetic garnet layer. The sheets have windows facing the patterns of the register, with the windows being arranged with end portions thereof in registration with the pattern boundaries to enable the bubbles to circulate while remaining in contact with the boundaries of the major register pattern in implanted zones of the garnet.

5 Claims, 3 Drawing Figures

MAGNETIC BUBBLE MEMORY

BACKGROUND OF THE INVENTION

The present invention relates to a magnetic bubble memory. It applies to the storage of binary information in the form of isolated magnetic domains, called bubbles. These domains have a reverse magnetization to that of the remainder of the magnetic material constituting the layer in which they are formed.

It is known that each bubble can be displaced by a force and that this displacement can take place freely in a random direction in the plane of the magnetic layer. The latter is a magnetic garnet and the bubbles are formed in this garnet by applying a continuous magnetic field thereto, which is perpendicular to the plane of the layer. This field is produced by a permanent magnet, ensuring the nonvolatility of the information contained in the memory.

The magnetic garnet layer in which the bubbles are formed is generally supported by an amagnetic monocrystalline garnet.

It is also known to produce a bubble memory in an organization comprising a series of longitudinally oriented minor shift registers, and at least one transversely oriented major access register. These minor and major registers are constituted by patterns, whose boundaries are defined by the contours of ionically implanted zones of the magnetic garnet layer. In per se known manner, access register has one or more access points at one access end of each minor register. It is also known to use means for displacing the bubbles in each minor register by applying a rotating magnetic field and to use means for displacing the bubbles in the major register by circulating currents in two electrically conductive perforated sheets which are superimposed on the magnetic garnet layer, which are isolated from one another and from said layer and positioned facing the major register patterns. This known type of memory is, for example, described in French Pat. No. 2 480 983, whereof the application was filed on Apr. 18th 1980 in the name of the present Applicant.

In this known bubble memory, each bubble having to be transferred from a minor register to a major register must be disengaged from the boundary of the final pattern of the corresponding minor register in order to be propagated in to the major register, by means of electrical currents circulating in two sheets superimposed on the magnetic garnet layer. These bubbles circulate either in an implanted zone, or in an unimplanted zone and their guidance in the major register towards the access station requires the circulation of high currents in the conductive sheets, due to the fact that these bubbles, in the major register, are not permanently guided along the boundaries of the juxtaposed patterns.

The propagation of the bubbles by current circulation in electrically conductive sheets is also described in French Pat. 2 428 890. As in the memory described hereinbefore, as the bubbles no longer bear on the boundary of the patterns defined by ionic implantation, it is necessary to have a high current in order to guide the bubbles towards a given point.

SUMMARY OF THE INVENTION

The invention aims at obviating these disadvantages and more particularly at providing a magnetic bubble memory organized in the form of minor and major registers, having patterns defined by ionic implantation in a magnetic garnet layer, in which the bubbles are displaced in the minor registers by a rotating magnetic field and in the major registers by currents circulating in electrically conductive sheets, which have windows and are superimposed on the magnetic garnet layer. The circulation of the bubbles in the major register is such that there is maximum contact between the bubbles and the boundaries of the patterns defining said register. The main advantage of this organization is to ensure a better guidance of the bubbles towards an access station, without having to use high currents in the conductive sheets.

Another important advantage is that as the bubble is always located in a potential trough created by the border of the unimplanted zone, transfer takes place by simply activating propagation by current following the propagation by rotating field, or vice versa.

The present invention therefore specifically relates to a magnetic bubble memory having a series of longitudinally oriented minor shift registers and at least one transversely oriented major access register, said minor and major registers having patterns, whereof the boundaries are defined by ionically implanted zones of a magnetic garnet layer, means for transferring the bubble from one end of the minor register to the major register, means for displacing the bubbles in each minor register by applying a rotating magnetic field, means for displacing the bubbles in the major register by the circulation of currents in two electrically conductive sheets superimposed on the magnetic garnet layer, which are isolated from one another and from said layer and which are provided with windows facing the patterns of said register, wherein the windows are arranged in such a way that the bubbles circulate whilst remaining in contact with the boundaries of the patterns of the major register in the implanted zones of the garnet.

According to another feature, the major register comprises successions of patterns respectively corresponding to each minor register which are separated by implanted zones and arranged laterally with respect to the minor register, windows in each of the two conductive sheets having common surface portions with the patterns of the major register for each succession of patterns, at least one of the two sheets having a window between each succession of patterns.

According to another feature, the transfer means incorporate longitudinally disposed buffer registers, respectively between the access ends of the minor registers and the successions of patterns of the major registers, said buffer registers being constituted by patterns defined by ionic implantation of the magnetic garnet layer, at least one end pattern of each buffer register being adjacent to a pattern of the corresponding succession of patterns of the major register.

According to another feature, the transfer means also comprise an electrical conductor able to receive transfer current pulses, said conductor being transversely oriented and forming inverted slot-like projections respectively connecting the access ends of the minor registers and the corresponding buffer registers.

According to another feature, the major register comprises laterally arranged adjacent access patterns to the minor registers, the access means being respectively constituted by end patterns of the minor registers aligned with adjacent access patterns, which are separated from one another by implanted zones, the windows in each of the two conductive sheets having common surface portions with the patterns of the major register, at least one of the two sheets having a window between the end patterns, the shape of each end pattern being such that it permits the separate transfer of the two bubbles present in a minor register, towards the access patterns.

Finally, according to another feature, the bubbles can be duplicated at the ends of the minor registers and the buffer registers.

BRIEF DESCRIPTION OF THE DRAWINGS

The invention is described in greater detail hereinafter relative to non-limitative embodiments and with reference to the attached drawings, wherein show.

DETAILED DESCRIPTION OF THE PREFERRED EMBODIMENTS

Figure 1:
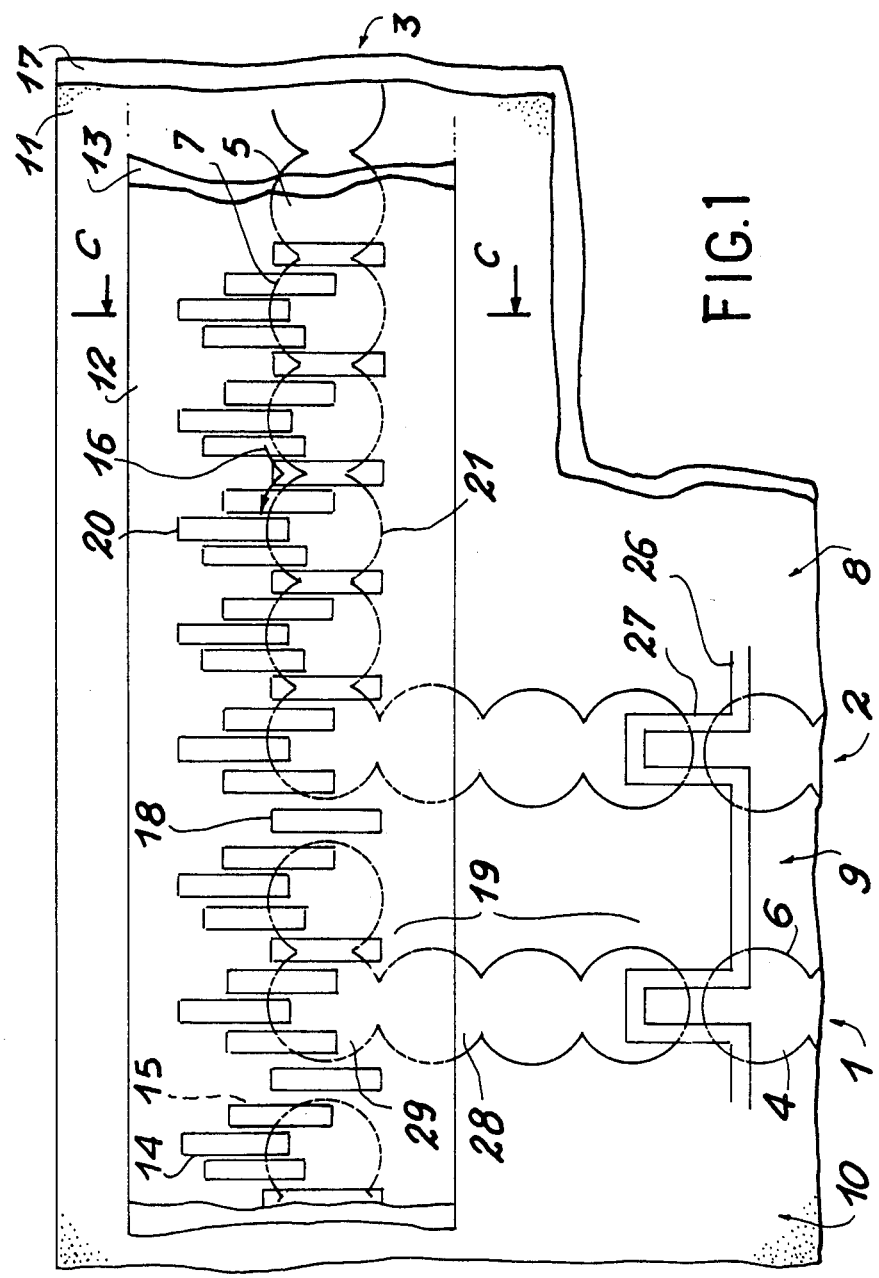
FIG. 1 diagrammatically and in plan view an embodiment of a bubble memory according to the invention.

FIG. 1 diagrammatically shows in plan view a first embodiment of a bubble memory according to the invention. This memory comprises a series of minor shift registers 1, 2, . . . , whose number has been limited to two in the drawing in order to facilitate representation. These minor registers are longitudinally oriented. The memory also comprises at least one major register 3, which is transversely oriented with respect to the minor registers. The minor and major registers are constituted by patterns such as 4, 5, whose boundaries 6, 7 are defined by ionic implantation zones 8, 9, 10 . . . in a magnetic garnet layer 7 supported by an amagnetic substrate 17. In this embodiment, the patterns are circular, but it is obvious that any other shape could be suitable and in particular e.g. a lozenge shape. In this embodiment, the boundaries of these patterns are circles, which are tangential to one another for minor registers 1, 2. Major register 3 has successions of circular patterns separated by implanted zones of the magnetic garnet layer 11. In each succession, the boundaries of the patterns are circles which are tangential to one another. The interior of the patterns for the minor and major registers are unimplanted zones of magnetic garnet layer 11. The bubble memory shown also comprises means for displacing the bubbles in each minor register by applying a rotating magnetic field. These known means are not shown in the drawing. The bubbles are displaced in major register 3 by the circulation of currents in two electrically conductive sheets 12, 13 superimposed on the magnetic garnet layer 11 and which are isolated from one another and from the garnet layer and which have windows 14, 15, 20 facing the patterns of major register 3. According to the invention, these windows are arranged in such a way that the bubbles are displaced, in the manner shown by arrow 16, whilst remaining in contact with the boundaries of the major register patterns 5, in the implanted zones of garnet 11. The circulation of a bubble between two patterns respectively belonging to two adjacent successions of major register patterns is ensured by means of the current circulating in conductive sheet 12 and as a result of intermediate windows 18. This memory structure makes it possible to ensure a good guidance of the bubbles in the major register, without having to use intense currents in the conductive sheets 12, 13.

By stopping the rotational field, the bubbles are propagated in the major register, e.g. in the direction of arrow 16, by means of currents circulating in conductive sheets 12, 13. Each bubble can be directed towards a reception station, not shown in the drawing, or can be transferred from one minor register to another.

The memory also has means for transferring the bubbles from the ends of the minor registers to the major register 3. In this embodiment, the transfer means comprise longitudinally arranged buffer registers 19, respectively between the access ends (patterns 4) of minor registers 1 and the successions of patterns of major register 3. These buffer registers are constituted by patterns defined by ionic implantation of magnetic garnet layer 11. They are longitudinally oriented in the same way as the corresponding minor registers. The transfer means also comprise an electrical conductor 26 able to receive transfer current pulses. This conductor is transversely oriented in the same way as major register 3 and it forms inverted slot-like projections 27 respectively connecting the access ends of minor register 1 to the correxponding buffer registers. Each buffer register 19 comprises at least one end pattern 28 adjacent to a pattern 29 of the corresponding succession of patterns of major register 3. In this first embodiment, the structure of the bubble memory permits in per se known manner the duplication of the bubbles present at the ends of the minor registers of the buffer registers before ensuring the transfer thereof. This duplication takes place in per se known manner and is not described in detail here. The conductor 26 associated with the buffer register acts as a transfer gate.

Figure 2:
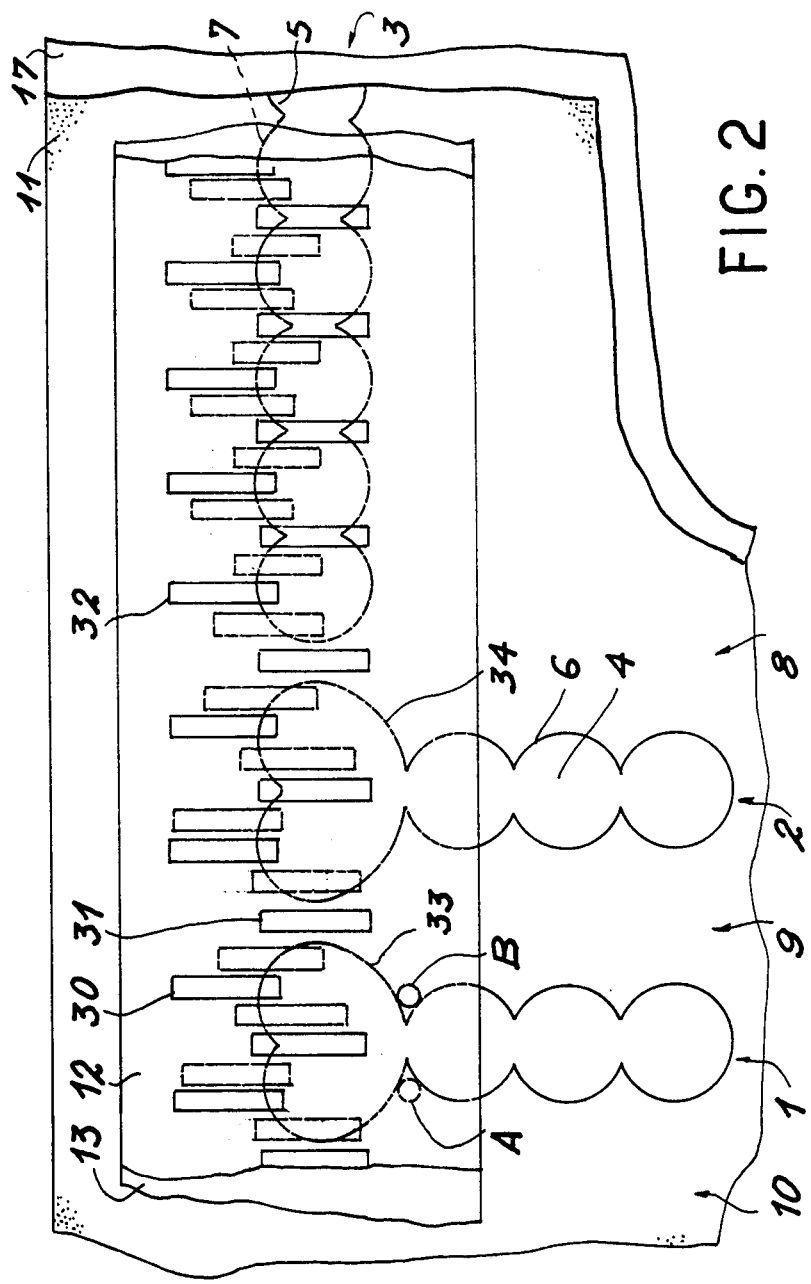
FIG. 2 diagrammatically and in plan view, a second embodiment of a bubble memory according to the invention.

FIG. 2 shows another embodiment of the memory according to the invention. The same elements carry the same references as in FIG. 1. It is possible to see minor registers 1, 2 and major register 3, constituted by patterns 4, 5, whose boundaries 6, 7 are defined by ionic implantation zones 9, 10 in the magnetic garnet layer 11 supported by the amagnetic substrate 17. It is also possible to see two conductive sheets 12, 13 superimposed on the magnetic garnet layer 11, which are isolated from one another and from the magnetic garnet layer and which have windows 30, 31, 32. In this embodiment, the major register 3 comprises adjacent patterns 5 for access to the minor registers. These access patterns are laterally arranged. In this case, the access means are respectively constituted by patterns 33, 34 located at the ends of minor registers 1, 2 and aligned with the access patterns of major register 3. These end patterns 33, 34 are separated from one another by unimplanted zones of substrate 11. The windows 32 of each of the conductive sheets 12 13 have common surface portions with the patters 5 of major register 3. One of the conductive sheets, such as e.g. sheet 12, has windows 31 between end patters 33, 34 of the minor registers. The shape of each end pattern is such that this pattern makes possible to separate transfer of two bubbles A, B present in a minor register towards the access patterns 5 of major register 3. In this embodiment, bubbles A, B can be displaced simultaneously in the direction of the major register or another minor register, which makes it possible to double the information flow rate in the memory. The end patterns 33, 34 are heart-shaped, but it is obvious that any other shape having simultaneous access to two bubbles contained in a minor register can be suitable.

Figure 3:
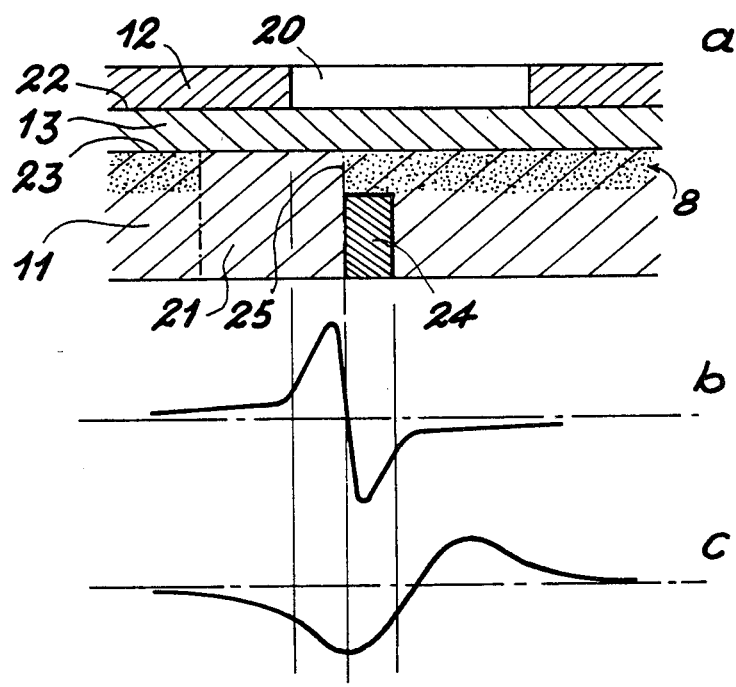
FIG. 3 a diagrammatic partial cross-section of the memory of FIG. 1, facing the access register.

FIG. 3 diagrammatically shows at (a) a partial cross-section C through the memory of FIG. 1. The latter permits a better understanding of the advance of the bubbles in major register 3. It is possible to see the conductive layers 12, 13, which are electrically insulated from one another by insulating layer 12 and are insulated from the magnetic garnet layer 11 by an insulating layer 23. The ionic implantation zone in magnetic garnet 11 is represented at 8, whilst the unimplanted pattern on the boundary of which bears a bubble 24 is diagrammatically represented at 21. The boundary 25 between implanted zone 8 of magnetic garnet 11 and unimplanted zone 21 of this layer (shown by haching in this drawing) is an important limit, where there is a magnetic field trough as shown in the diagram of FIG. 3. The magnetic field produced by the circulation of the current in the conductive sheets is shown on the diagram of FIG. 3c. This field trough is added to that existing on the boundaries of the unimplanted zones (3b) and permits the propagation of bubbles. The magnetic field trough shown in FIG. 3b makes it possible to maintain bubble 24 in contact with boundary 25. The bubble is displaced whilst remaining in contact with said boundary, when the current circulates in the conductive sheets. When the bubble circulate in the minor registers, as a result of the application of a rotating field, they also remain in contact with the boundaries of the corresponding patterns. The potential trough produced on the boundaries of the unimplanted patterns in the major register 3 prevents the disengagement of the bubbles from the boundaries. The magnetic field troughs on the boundaries of the magnetic register patterns are used for guiding the bubbles whilst the windows in the conductive sheets are used for propagating the bubbles as a result of the currents in these sheets. The same applications are obviously also possible in the embodiment according to FIG. 2.

The invention clearly makes it possible to achieve the objectives referred to hereinbefore. The bubbles circulate in the major register without it being necessary to use high currents in the electrically conductive sheets. The bubbles remaining in contact with the unimplanted patterns of this register. They also circulate in the minor registers as a result of the application of a rotating field, whilst remaining in contact with the boundaries of the unimplanted patterns of these registers. Thus, the guidance of the bubbles is perfectly ensured.

Another important advantage is that with the bubbles still in a potential trough produced by the border of the unimplanted zone. Transfer simply takes place by activating proagation by current following propagation of the rotating field, or vice versa.

What is claimed is:

1. A magnetic bubble memory having a series of longitudinally oriented minor shift registers and at least one transversely oriented major access register said minor and said major registers having patterns whereof the boundaries are defined by ionically implanted zones of a magnetic garnet layer, means for transferring the bubble from one end of the minor register to the major register, means for displacing the bubbles in each minor register by applying a rotating magnetic field, means for displacing the bubbles in the major register by the circulation of currents in two electrically conductive sheets superimposed on the magnetic garnet layer, which sheets are isolated from one another and from said layer, and which sheets are provided with windows facing the patterns of said register, wherein end portions of a succession of the windows are in registration with the register pattern boundaries defined by said ionically implanted zones to enable the bubbles to circulate whilst remaining in contact with the boundaries of the patterns of the major register in the implanted zones of the garnet, and wherein the major register comprises successions of patterns respectively corresponding to each minor register which are separated by implanted zones and arranged laterally with respect to the minor register, windows in each of the two conductive sheets having common surface portions with the patterns of the major register for each succession of patterns, at least one of the two sheets having a window between each succession of patterns.

2. A magnetic bubble memory having a series of longitudinally oriented minor shift registers and at least one transversely oriented major access register, said minor and said major registers having patterns whereof the boundaries are defined by ionically implanted zones of a magnetic garnet layer, means for transferring the bubble from one end of the minor register to the major register, means for displacing the bubbles in each minor register by applying a rotating magnetic field, means for displacing the bubbles in the major register by the circulation of currents in two electrically conductive sheets superimposed on the magnetic garnet layer, which sheets are isolated from one another and from said layer, and which sheets are provided with windows facing the patterns of said register, wherein the windows are arranged in such a way that the bubbles circulate whilst remaining in contact with the boundaries of the patterns of the major register in the implanted zones of the garnet; and wherein the major register comprises successions of patterns respectively corresponding to each minor register which are separated by implanted zones and arranged laterally with respect to the minor register, windows in each of the two conductive sheets having common surface portion with the patterns of the major register for each succession of patterns, at least one of the two sheets having a window betwen each succession of patterns; and wherein the transfer means incorporate longitudinally disposed buffer registers respectively between the access ends of the minor registers and the successions of patterns of the major registers, said buffer registers being constituted by patterns defined by ionic implantation of the magnetic garnet layer, at least one end pattern of each buffer register being adjacent to a pattern of the corresponding succession of patterns of the major register.

3. A bubble memory according to claim 2, wherein the transfer means also comprise an electrical conductor able to receive transfer current pulses, said conductor being transversely oriented and forming inverted slot-like projections respectively connecting the access ends of the minor registers and the corresponding buffer registers.

4. A bubble memory according to claim 2, wherein the bubbles can be duplicated at the ends of the minor registers and the buffer registers.

5. A magnetic bubble memory having a series of longitudinally oriented minor shift registers and at least one transversely oriented major access register, said minor and said major registers having patterns whereof the boundaries are defined by ionically implanted zones of a magnetic garnet layer, means for transferring the bubble from one end of the minor register to the major register, means for displacing the bubbles in each minor register by applying a rotating magnetic field, means for displacing the bubbles in the major register by the circulation of currents in two electrically conductive sheets superimposed on the magnetic garnet layer, which sheets are isolated from one another and from said layer, and which sheets are provided with windows facing the patterns of said register, wherein end portions of a succession of the windows are in registration with the register pattern boundaries defined by said ionically implanted zones to enable the bubbles to circulate whilst remaining in contact with the boundaries of the patterns of the major register in the implanted zones of the garnet, and wherein the major register comprises laterally arranged adjacent access patterns to the minor registers, the access means being respectively constituted by end patterns of the minor registers aligned with adjacent access patterns, which are separated from one another by implanted zones, the windows in each of the two conductive sheets having common surface portions with the patterns of the major register, at least one of the two sheets having a window between the end patterns, the shape of each end pattern being such that it permits the separate transfer of the two bubbles present in a minor register, towards the access patterns.

* * * * *